(12) United States Patent
Hua et al.

(10) Patent No.: US 11,949,008 B2
(45) Date of Patent: Apr. 2, 2024

(54) SEMICONDUCTOR STRUCTURE AND METHOD FOR FORMING THE SAME

(71) Applicant: WIN SEMICONDUCTORS CORP., Taoyuan (TW)

(72) Inventors: Chang-Hwang Hua, Taoyuan (TW); Chia-Hao Chen, Taoyuan (TW)

(73) Assignee: WIN SEMICONDUCTORS CORP., Taoyuan (TW)

(*) Notice: Subject to any disclaimer, the term of this patent is extended or adjusted under 35 U.S.C. 154(b) by 629 days.

(21) Appl. No.: 17/137,587

(22) Filed: Dec. 30, 2020

(65) Prior Publication Data

US 2022/0208999 A1 Jun. 30, 2022

(51) Int. Cl.
| | | |
|---|---|---|
| H01L 29/778 | (2006.01) | |
| H01L 29/16 | (2006.01) | |
| H01L 29/20 | (2006.01) | |
| H01L 29/66 | (2006.01) | |

(52) U.S. Cl.
CPC ........ H01L 29/778 (2013.01); H01L 29/1608 (2013.01); H01L 29/2003 (2013.01); H01L 29/66462 (2013.01)

(58) Field of Classification Search
CPC ............... H01L 29/778; H01L 29/1608; H01L 29/2003; H01L 29/66462
See application file for complete search history.

(56) References Cited

U.S. PATENT DOCUMENTS

| 7,741,218 B2 | 6/2010 | Sparks et al. |
| 10,720,390 B2 | 7/2020 | Hua et al. |
| 11,177,216 B2 | 11/2021 | LaRoche et al. |
| 2016/0030810 A1 | 2/2016 | Ben-Arie |
| 2019/0371714 A1* | 12/2019 | Shimura ................. H01L 29/78 |
| 2021/0375856 A1* | 12/2021 | Alcorn .................... H01L 24/73 |
| 2022/0068708 A1* | 3/2022 | Boles ..................... H01L 29/475 |

FOREIGN PATENT DOCUMENTS

| TW | 201831246 A | 9/2018 |
| TW | 202017107 A | 5/2020 |

OTHER PUBLICATIONS

Chinese language office action dated Aug. 23, 2022, issued in application No. TW 110128298.

* cited by examiner

Primary Examiner — Olatunji A Godo

(74) Attorney, Agent, or Firm — McClure, Qualey & Rodack, LLP

(57) ABSTRACT

A semiconductor structure is provided. The semiconductor structure includes a substrate having a front side and a back side opposite the front side. The semiconductor structure also includes a first contact metal layer disposed on the front side of the substrate. The semiconductor structure further includes a III-V compound semiconductor layer disposed between the substrate and the first contact metal layer. Moreover, the semiconductor structure includes a via hole penetrating through the substrate and the III-V compound semiconductor layer from the back side of the substrate. The bottom of the via hole is defined by the first contact metal layer, and the first contact metal layer includes molybdenum, tungsten, iridium, palladium, platinum, cobalt, ruthenium, osmium, rhodium, rhenium, or a combination thereof.

20 Claims, 5 Drawing Sheets

SEMICONDUCTOR STRUCTURE AND METHOD FOR FORMING THE SAME

BACKGROUND

Technical Field

Embodiments of the present disclosure relate to a semiconductor structure and a method for forming the same, and in particular they relate to a semiconductor structure that includes a III-V compound semiconductor layer and a method for forming the same.

Description of the Related Art

III-V compound semiconductor materials are known for their wide bandgap characteristics (e.g., the bandgap of gallium nitride (GaN) may be as high as 3.4 eV) and high breakdown voltage. Therefore, III-V compound semiconductor materials have been favorable materials for high temperature and/or high power application. Recently, the semiconductor that includes III-V compound semiconductor materials has been applied to the fabrication of high-power and high-frequency devices, such as GaN high-electron-mobility transistor (HEMT).

However, when forming a back-side via hole in the traditional GaN high-electron-mobility transistor, an etching process should be performed and stopped at the GaN layer. Additionally, a cleaning process for the back-side via hole inside the substrate is also necessary. Then, another etching process should be taken to remove the GaN layer under the back-side via hole, and another cleaning process for the back-side via hole after GaN etching is needed. The main purpose of the multistep process is to prevent the front-side metal, such as titanium (Ti), from damage during the process. However, the multistep process is complex, time-consuming, and costly.

SUMMARY

The semiconductor structure according to some embodiments of the present disclosure includes a back-side via hole. The back-side via hole penetrates through a substrate and a III-V compound semiconductor layer on the substrate. The bottom of the back-side via hole is defined by a first contact metal layer on the III-V compound semiconductor layer. The first contact metal layer may serve as an etch stop layer during the formation of the back-side via hole, and thus the substrate and the III-V compound semiconductor layer may be both etched with a higher etching rate without damaging the metal layers disposed on the first contact metal layer during the formation of the back-side via hole. Therefore, it may effectively simplify the process, reduce the overall processing time and cost, and improve the overall yield, making it suitable for mass production.

Some embodiments of the present disclosure include a semiconductor structure. The semiconductor structure includes a substrate having a front side and a back side opposite the front side. The semiconductor structure also includes a first contact metal layer disposed on the front side of the substrate. The semiconductor structure further includes a III-V compound semiconductor layer disposed between the substrate and the first contact metal layer. Moreover, the semiconductor structure includes a via hole penetrating through the substrate and the III-V compound semiconductor layer from the back side of the substrate. The bottom of the via hole is defined by the first contact metal layer, and the first contact metal layer includes molybdenum, tungsten, iridium, palladium, platinum, cobalt, ruthenium, osmium, rhodium, rhenium, or a combination thereof.

Some embodiments of the present disclosure include a method for forming a semiconductor structure. The method includes forming a III-V compound semiconductor layer on a front side of a substrate. The method also includes forming a first contact metal layer on the III-V compound semiconductor layer. The first contact metal layer includes molybdenum, tungsten, iridium, palladium, platinum, cobalt, ruthenium, osmium, rhodium, rhenium, or a combination thereof. The method further includes forming a via hole. The via hole penetrates through the substrate and the III-V compound semiconductor layer from a back side of the substrate and exposes a portion of the first contact metal layer.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
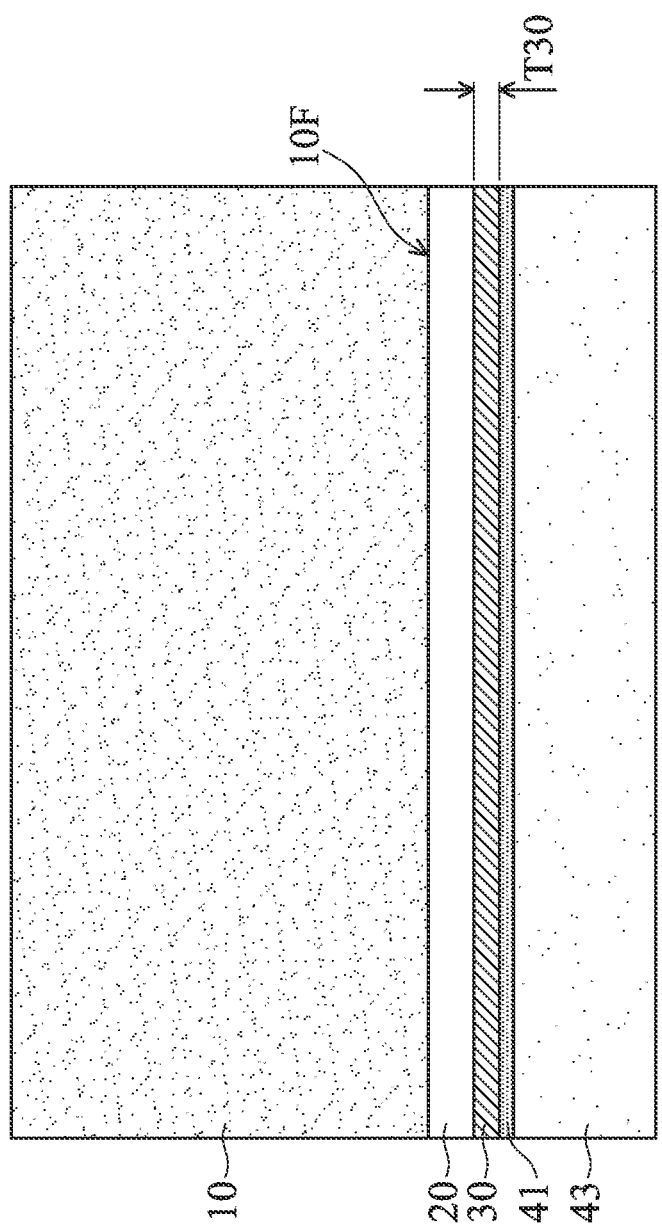
FIG. 1 is a partial cross-sectional view illustrating a semiconductor structure at one stage of manufacture in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

The semiconductor structure in the embodiments of the present disclosure may be used in a radio-frequency device, such as a power amplifier, but the present disclosure is not limited thereto. The semiconductor structure shown in the embodiments of the present disclosure may also be applied to other suitable devices, depending on requirements.

Embodiments of the present disclosure provide a semiconductor structure including a substrate, a first contact metal layer, and a III-V compound semiconductor layer between the substrate and the first contact metal layer. The first contact metal layer may include molybdenum, tungsten, iridium, palladium, platinum, cobalt, ruthenium, osmium, rhodium, rhenium, or a combination thereof. The first contact metal layer may have high etching selectivity with respect to the substrate and the III-V compound semiconductor layer. Therefore, the efficiency of the etching process for forming a via hole penetrating through the substrate and the III-V compound semiconductor layer may be improved without damaging other metal layers underlying the first contact metal layer.

FIGS. 1-4 are partial cross-sectional views illustrating a semiconductor structure 100 at various stages of manufacture in accordance with some embodiments. It should be noted that some components may be omitted in FIGS. 1-4, for the sake of brevity.

Referring to FIG. 1, in some embodiments, a substrate 10 is provided. The substrate 10 may include an elemental semiconductor (e.g., silicon, germanium), a compound semiconductor (e.g., tantalum carbide (TaC), gallium arsenide (GaAs), indium arsenide (InAs) or indium phosphide (InP)), an alloy semiconductor (e.g., silicon germanium (SiGe), silicon germanium carbide (SiGeC), gallium arsenic phosphide (GaAsP) or gallium indium phosphide (GaInP)), any other applicable semiconductor, or a combination thereof, but the present disclosure is not limited thereto.

In some embodiments, the substrate 10 is a semiconductor-on-insulator (SOI) substrate. For example, the substrate 10 may be a silicon-on-insulator substrate. In some embodiments, the substrate 10 is a semiconductor wafer (e.g., a silicon wafer, or any other applicable semiconductor wafer). In some embodiments, the substrate 10 includes a silicon carbide (SiC) substrate, an aluminum nitride substrate, a sapphire substrate, the like, or a combination thereof, but the present disclosure is not limited thereto.

Referring to FIG. 1, in some embodiments, a III-V compound semiconductor layer 20 is formed on the front side 10F of the substrate 10. In some embodiments, the III-V compound semiconductor layer 20 includes gallium nitride (GaN), aluminum nitride (AlN), aluminum gallium nitride (AlGaN), aluminum indium nitride (AlInN), aluminum indium gallium nitride (AlInGaN), the like, or a combination thereof, but the present disclosure is not limited thereto. Moreover, the III-V compound semiconductor layer 20 may be formed by a deposition process, such as chemical vapor deposition (CVD), atomic layer deposition (ALD), molecular beam epitaxy (MBE), liquid phase epitaxy (LPE), the like, or a combination thereof.

In some embodiments, the III-V compound semiconductor layer 20 includes a semiconductor device, or at least a portion of a semiconductor device. In some embodiments, the semiconductor device is a high-electron-mobility transistor (HEMT). For example, the semiconductor device may be a GaN HEMT.

Then, referring to FIG. 1, in some embodiments, a first contact metal layer 30 is formed on the III-V compound semiconductor layer 20. In some embodiments, the first contact metal layer 30 is in direct contact with the III-V compound semiconductor layer 20. In some embodiments, the first contact metal layer 30 includes molybdenum (Mo), tungsten (W), iridium (Ir), palladium (Pd), platinum (Pt), cobalt (Co), ruthenium (Ru), osmium (Os), rhodium (Rh), rhenium (Re), the like, or a combination thereof. In some embodiments, the first contact metal layer 30 includes molybdenum silicide, tungsten silicide, iridium silicide, palladium silicide, platinum silicide, cobalt silicide, ruthenium silicide, osmium silicide, rhodium silicide, rhenium silicide, or a combination thereof. The first contact metal layer 30 may have good diffusion ability. Therefore, in some embodiments, the adhesion between the first contact metal layer 30 and the III-V compound semiconductor layer 20 can be improved by a thermal annealing process.

For example, the first contact metal layer 30 may be formed by physical vapor deposition (PVD), chemical vapor deposition, atomic layer deposition, evaporation, sputtering, electroplating, the like, or a combination thereof.

In some embodiments, the thickness T30 of the first contact metal layer 30 is greater than or equal to 500 Å. In some embodiments, the thickness T30 is between about 500 Å and about 2,500 Å. In some embodiments, the thickness T30 is between about 2,500 Å and about 5,000 Å. In some embodiments, the thickness T30 is between about 5,000 and about 7,500 Å. In some embodiments, the thickness T30 is between about 7,500 Å and about 10,000 Å. The thickness T30 of the first contact metal layer 30 may be adjusted to improve the efficiency of an etching process for forming a via hole penetrating through the substrate 10 and the III-V compound semiconductor layer 20.

In some embodiments, after the first contact metal layer 30 is formed on the III-V compound semiconductor layer 20, a thermal annealing process is performed, so that the first contact metal layer 30 may have good adhesion with (the surface of) the III-V compound semiconductor layer 20.

Then, referring to FIG. 1, in some embodiments, a second contact metal layer 41 is formed on the first contact metal layer 30. In some embodiments, the second contact metal layer 41 includes titanium (Ti), gold (Au), or platinum (Pt), the like, or a combination thereof. In some embodiments, a third contact metal layer 43 is formed on the second contact metal layer 41. In some embodiments, the third contact metal layer 43 includes titanium (Ti), gold (Au), or platinum (Pt), the like, or a combination thereof.

In some embodiments, the first contact metal layer 30 is a platinum layer, the second contact metal layer 41 is a titanium layer, and the third contact metal layer 43 is a gold layer. The first contact metal layer 30 may protect the second contact metal layer 41 and the third contact metal layer 43 from damage during the etching process for forming a via hole penetrating through the substrate 10 and the III-V compound semiconductor layer 20. In addition, the first contact metal layer 30 may also protect the second contact metal layer 41 and the third contact metal layer 43 from damage during the cleaning process for the via hole.

For example, the second contact metal layer 41 and the third contact metal layer 43 may be formed by a deposition process. The deposition process may include physical vapor deposition, chemical vapor deposition, atomic layer deposition, evaporation, sputtering, electroplating, the like, or a combination thereof.

Figure 2:
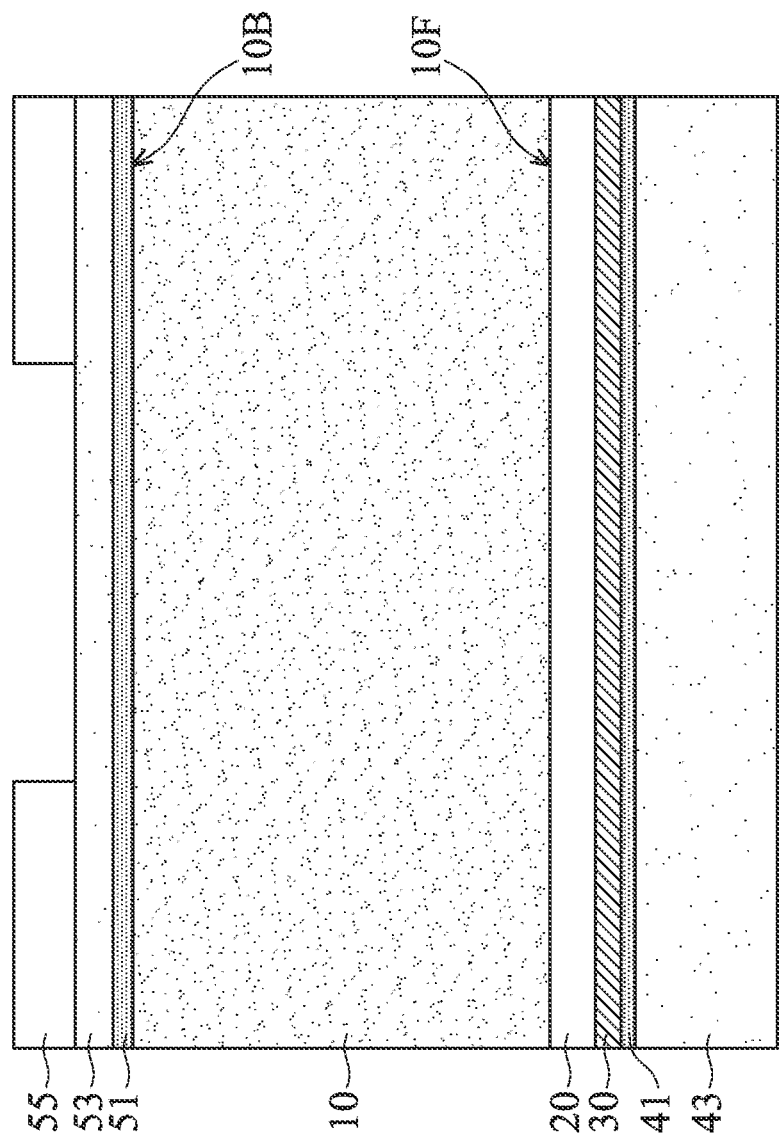
FIG. 2 is a partial cross-sectional view illustrating a semiconductor structure at one stage of manufacture in accordance with some embodiments.

Then, as shown in FIG. 2, in some embodiments, at least one metal layer is formed on the back side 10B (which is opposite the front side 10F) of the substrate 10 by a deposition process. The examples of the deposition process are described above and will not be repeated here. In some embodiments, as shown in FIG. 2, a titanium layer 51 is coated on the back side 10B of the substrate 10, and a gold layer 53 is formed on the titanium layer 51. The titanium layer 51 may have a better adhesion with the substrate 10.

Then, in some embodiments, as shown in FIG. 2, a mask layer 55 is formed on the metal layer (e.g., the gold layer 53). The mask layer 55 may include nickel (Ni), but the present disclosure is not limited thereto. The mask layer 55 may be formed by a deposition process, a photolithography process, other suitable processes, or a combination thereof. The examples of the deposition process are described above and will not be repeated here. For example, the photolithography process may include photoresist coating (e.g., spin coating), soft baking, mask aligning, exposure, post-exposure baking (PEB), developing, rinsing, drying (e.g., hard baking), other suitable processes, or a combination thereof.

Figure 3:
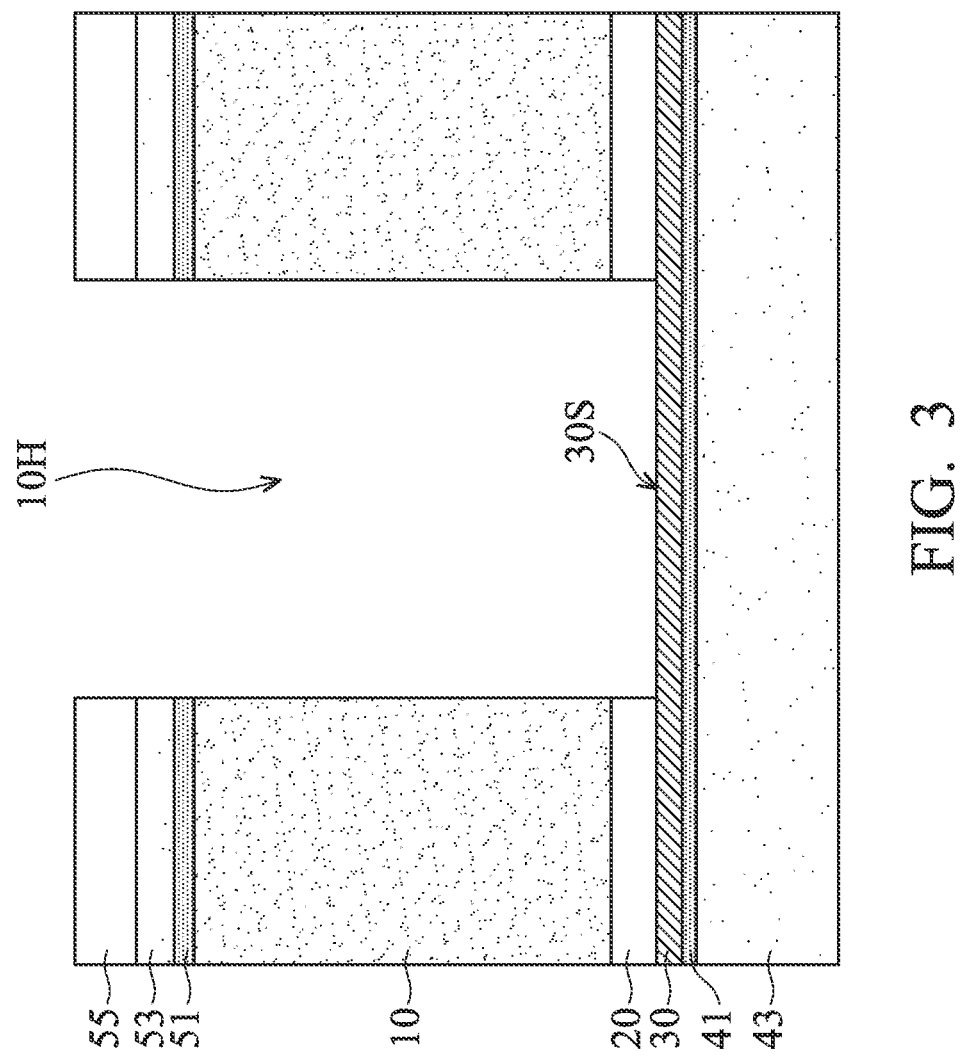
FIG. 3 is a partial cross-sectional view illustrating a semiconductor structure at one stage of manufacture in accordance with some embodiments.

Then, as shown in FIG. 3, an etching process may be performed to form a via hole 10H by using the mask layer 55 as an etch mask. In some embodiments, the substrate 10 and the III-V compound semiconductor layer 20 are etched through the mask layer 55. In some embodiments, the etching process includes a dry etching process. For example, the dry etching process may include reactive ion etch (RIE), inductively-coupled plasma (ICP) etching, neutral beam etch (NBE), electron cyclotron resonance (ERC) etching, the like, or a combination thereof. In some embodiments, the inductively-coupled plasma (ICP) etching process is performed to etch the gold layer 53, the titanium layer 51, the III-V compound semiconductor layer 20, and the substrate 10.

Referring to FIG. 2 and FIG. 3, in some embodiments, the substrate 10 and the III-V compound semiconductor layer 20 are patterned from the back side 10B of the substrate 10 to form the via hole 10H, and the via hole 10H exposes a portion of (the surface 30S of) the first contact metal layer 30. In some embodiments, the via hole 10H penetrates through the substrate 10 and the III-V compound semiconductor layer 20, and the bottom of the via hole 10H is defined by the first contact metal layer 30. In some embodiments, since the bottom of the via hole 10H is defined by the first contact metal layer 30 having high etching selectivity with respect to the substrate 10 and the III-V compound semiconductor layer 20 during the etching process for forming the via hole 10H, a high etching rate can be applied to etch both the substrate 10 and the III-V compound semiconductor layer 20, thereby improving the efficiency of the etching process for forming the via hole 10H. In some embodiments, the first contact metal layer 30 prevents the second contact metal layer 41 and the third contact metal layer 43 from damage during the formation of the via hole 10H, thereby improving the reliability of the semiconductor structure. In some embodiments, the first contact metal layer 30 serves as an etch stop layer in the etching process for forming the via hole 10H.

Figure 4:
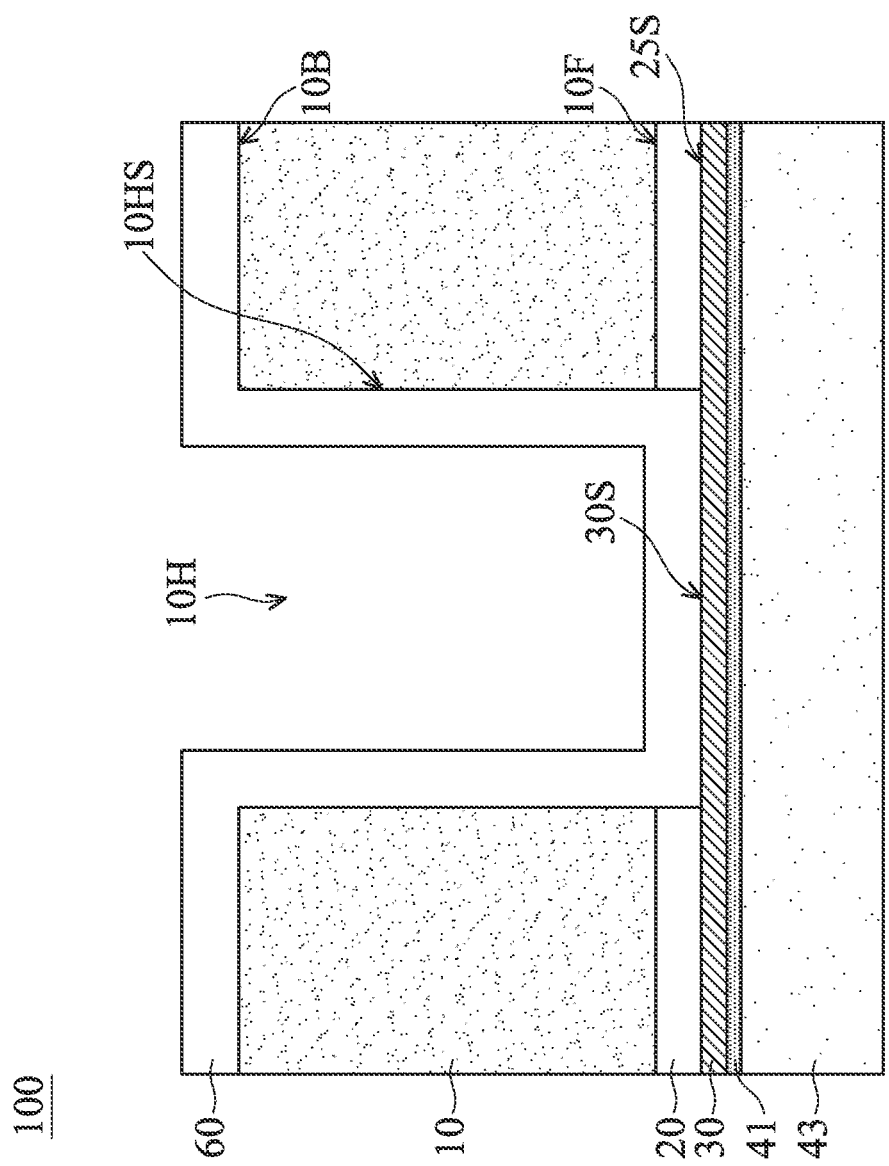
FIG. 4 is a partial cross-sectional view illustrating a semiconductor structure in accordance with some embodiments.

Then, referring to FIG. 4, in some embodiments, the titanium layer 51, the gold layer 53, and the mask layer 55 are removed. Then, in some embodiments, the via hole 10H is cleaned using a solution. For example, the solution used to clean the via hole 10H may include nitric acid ($HNO_3$), KI, $I_2$, sulfuric acid ($H_2SO_4$), hydrogen peroxide ($H_2O_2$), or a combination thereof. Alternately, the solution used to clean the via hole 10H may include, for example, hydrofluoric acid (HF), ammonium hydroxide ($NH_4OH$), or any suitable solution. The first contact metal layer 30 may not be affected by the step of removing the titanium layer 51, the gold layer 53, and the mask layer 55. Furthermore, the first contact metal layer 30 may protect the second contact metal layer 41 and the third contact metal layer 43 from damage during the step of cleaning the via hole 10H.

As shown in FIG. 4, in some embodiments, a back-side metal layer 60 is formed in the via hole 10H, so as to form a semiconductor structure 100. In some embodiments, the back-side metal layer 60 includes gold, nickel, platinum, palladium, iridium, titanium, chromium, tungsten, aluminum, copper, the like, an alloy thereof, or a combination thereof. For example, the back-side metal layer 60 may be formed on the back side 10B of the substrate 10, the sidewall 10HS of the via hole 10H, and the surface 30S of the first contact metal layer 30 by a deposition process as shown in FIG. 4. The examples of the deposition process are described above and will not be repeated here.

In some embodiments, the sidewall 10HS of the via hole 10H is substantially perpendicular to the contact surface 25S of the III-V compound semiconductor layer 20 and the first contact metal layer 30, but the present disclosure is not limited thereto.

Figure 5:
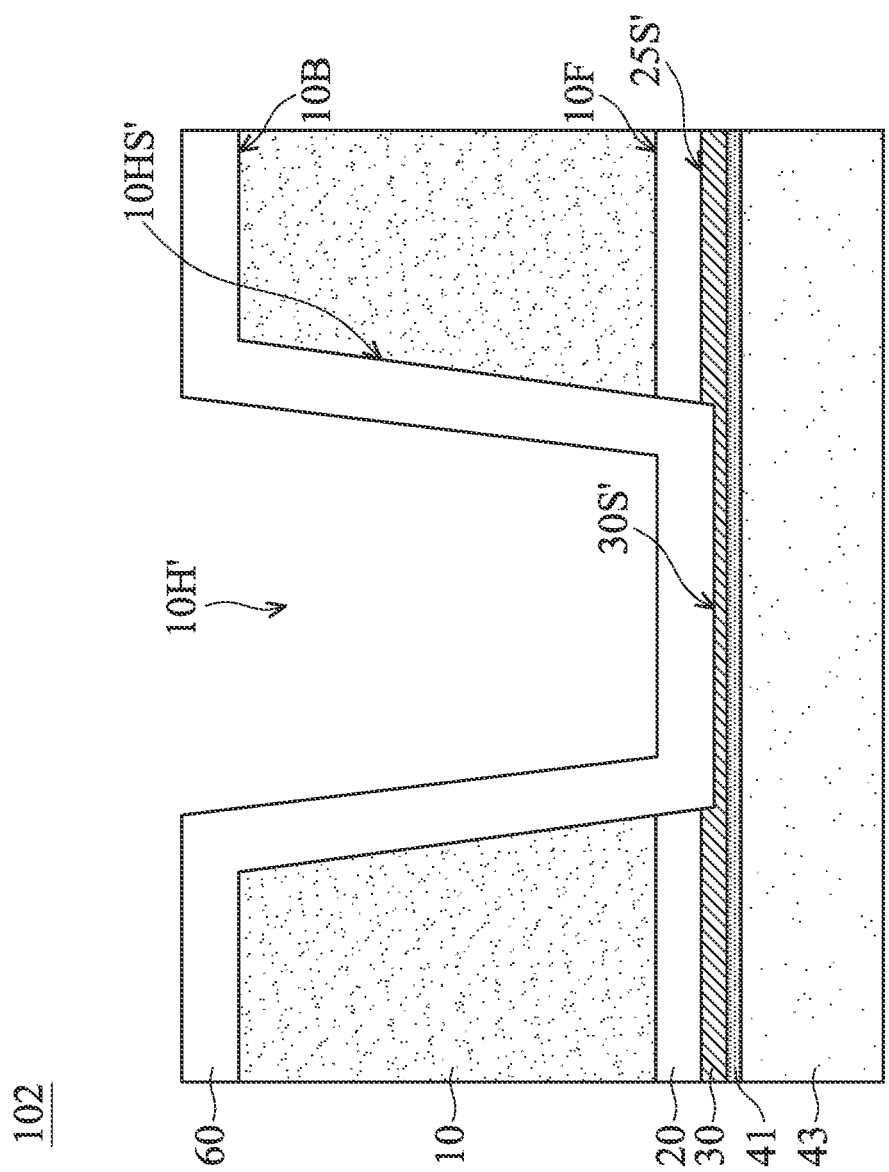
FIG. 5 is a partial cross-sectional view illustrating a semiconductor structure in accordance with some embodiments.

FIG. 5 is a partial cross-sectional view illustrating a semiconductor structure 102 in accordance with some embodiments. Referring to FIG. 5, in some embodiments, the via hole 10H' of the semiconductor structure 102 has an inclined sidewall 10HS'. The inclined sidewall 10HS' of the via hole 10H may not be perpendicular to the contact surface 25S' of the III-V compound semiconductor layer 20 and the first contact metal layer 30.

In some embodiments, as shown in FIG. 5, the first contact metal layer 30 is partially etched, so that the via hole 10H' further penetrates into a portion of the first contact metal layer 30. As shown in FIG. 5, the surface 30S' of the first contact metal layer 30 may be lower than the contact surface 25S' of the III-V compound semiconductor layer 20 and the first contact metal layer 30. Therefore, in some embodiments, the first contact metal layer 30 may provide larger contact surface for the back-side metal layer 60 to enhance the conductivity.

In summary, the semiconductor structure according to the embodiments of the present disclosure includes a first contact metal layer. The first contact metal layer may be used as an etch stop layer during the etching process for forming the back-side via hole penetrating through the substrate and the III-V compound semiconductor layer between the first contact metal layer and the substrate. The first contact metal layer may have high etching selectivity with respect to the substrate and the III-V compound semiconductor layer during the etching process for forming the back-side via hole. Therefore, the process time and the cost may be reduced, and/or the reliability of the semiconductor structure may be improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor structure, comprising:
   a substrate having a front side and a back side opposite the front side;
   a first contact metal layer disposed on the front side of the substrate;
   a second contact metal layer disposed on the first contact metal layer;
   a third contact metal layer disposed on the second contact metal layer;
   a III-V compound semiconductor layer disposed between the substrate and the first contact metal layer; and
   a via hole penetrating through the substrate and the III-V compound semiconductor layer from the back side of the substrate, wherein a bottom of the via hole is defined by the first contact metal layer, and the first contact metal layer comprises molybdenum, tungsten, iridium, palladium, platinum, cobalt, ruthenium, osmium, rhodium, rhenium, or a combination thereof,
   wherein the first contact metal layer, the second contact metal layer and the third contact metal layer overlap in a stacking direction.

2. The semiconductor structure as claimed in claim 1, wherein the first contact metal layer comprises molybdenum silicide, tungsten silicide, iridium silicide, palladium silicide, platinum silicide, cobalt silicide, ruthenium silicide, osmium silicide, rhodium silicide, rhenium silicide, or a combination thereof.

3. The semiconductor structure as claimed in claim 1, wherein a thickness of the first contact metal layer is greater than or equal to 500 Å.

4. The semiconductor structure as claimed in claim 1, wherein the second contact metal layer comprises titanium, gold, platinum, or a combination thereof.

5. The semiconductor structure as claimed in claim 1, wherein the second contact metal layer is disposed between the first contact metal layer and the third contact metal layer, and the third contact metal layer comprises titanium, gold, platinum, or a combination thereof.

6. The semiconductor structure as claimed in claim 1, wherein the substrate is a silicon carbide substrate, an aluminum nitride substrate, or a sapphire substrate.

7. The semiconductor structure as claimed in claim 1, wherein the III-V compound semiconductor layer comprises gallium nitride, aluminum nitride, aluminum gallium nitride, aluminum indium nitride, aluminum indium gallium nitride, or a combination thereof.

8. The semiconductor structure as claimed in claim 1, wherein at least a portion of a high-electron-mobility transistor is made by a portion of the III-V compound semiconductor layer.

9. The semiconductor structure as claimed in claim 8, wherein the high-electron-mobility transistor is a GaN high-electron-mobility transistor.

10. The semiconductor structure as claimed in claim 1, wherein the via hole further penetrates into a portion of the first contact metal layer.

11. The semiconductor structure as claimed in claim 1, wherein the first contact metal layer is in direct contact with the III-V compound semiconductor layer.

12. A method for forming a semiconductor structure, comprising:
    forming a III-V compound semiconductor layer on a front side of a substrate;
    forming a first contact metal layer on the III-V compound semiconductor layer, wherein the first contact metal layer comprises molybdenum, tungsten, iridium, palladium, platinum, cobalt, ruthenium, osmium, rhodium, rhenium, or a combination thereof;
    forming a second contact metal layer on the first contact metal layer, wherein the second contact metal layer covers the first contact metal layer;

forming a third contact metal layer on the second contact metal layer, wherein the third contact metal layer covers the second contact metal layer; and forming a via hole, wherein the via hole penetrates through the substrate and the III-V compound semiconductor layer from a back side of the substrate and exposes a portion of the first contact metal layer.

13. The method as claimed in claim 12, wherein the step of forming the via hole comprises:

forming a mask layer on the back side of the substrate;

etching the substrate and the III-V compound semiconductor layer through the mask layer; and removing the mask layer.

14. The method as claimed in claim 12, wherein the step of forming the via hole comprises:

performing an etching process on the substrate and the III-V compound semiconductor layer.

15. The method as claimed in claim 12, further comprising:

using a solution to clean the via hole.

16. The method as claimed in claim 15, wherein the solution comprises nitric acid, KI, $I_2$, sulfuric acid, hydrogen peroxide, or a combination thereof.

17. The method as claimed in claim 12, wherein after the step of forming the first contact metal layer, the method further comprises:

performing a thermal annealing process.

18. The method as claimed in claim 12, wherein a thickness of the first contact metal layer is greater than or equal to 500 Å.

19. The method as claimed in claim 12, wherein the substrate is a silicon carbide substrate, an aluminum nitride substrate, or a sapphire substrate.

20. The semiconductor structure as claimed in claim 1, wherein the first contact metal layer is platinum, the second contact metal layer is titanium and the third contact metal layer is gold, and the second contact metal layer is in direct contact with the first contact metal layer.

* * * * *